United States Patent [19]

Yu

[11] Patent Number: 5,742,084
[45] Date of Patent: Apr. 21, 1998

[54] PUNCHTHROUGH-TRIGGERED ESD PROTECTION CIRCUIT THROUGH GATE-COUPLING

[75] Inventor: Ta-Lee Yu, Hsinchu Hsien, Taiwan

[73] Assignee: Winbond Electronics Corporation, Taiwan

[21] Appl. No.: 681,381

[22] Filed: Jul. 23, 1996

[30] Foreign Application Priority Data

May 3, 1996 [TW] Taiwan ............................. 85105305

[51] Int. Cl.$^6$ ................................................ H01L 23/62
[52] U.S. Cl. ........................ 257/356; 257/358; 257/360; 257/361; 257/362; 257/365
[58] Field of Search ............................ 257/356, 358, 257/360, 361, 362, 365

[56] References Cited

U.S. PATENT DOCUMENTS 5,182,220  1/1993  Ker et al. ............................. 257/360

Primary Examiner—Edward Wojciechowicz
Attorney, Agent, or Firm—Rabin, Champagne & Lynt, P.C.

[57] ABSTRACT

A punchthrough-triggered ESD protection circuit which disposes an NMOS transistor at the anode gate of an lateral silicon-controlled rectifier, and a control circuit which provides a gate voltage for the gate of the NMOS transistor. By changing the channel length of the NMOS transistor as well as the gate voltage, the punchthrough voltage of the NMOS transistor is readily adjusted to a predetermined level. When ESD stress is present at the IC pad, the NMOS transistor goes into breakdown because of punchthrough and then triggers on the lateral silicon controlled rectifier. Thus, the trigger voltage of the ESD voltage can be lowered to the punchthrough voltage of the NMOS transistor. Accordingly, the ESD stress at the IC pad is bypassed by the conduction of the ESD protection circuit to allow an internal circuit to be protected from ESD damage.

22 Claims, 4 Drawing Sheets

5,742,084

PUNCHTHROUGH-TRIGGERED ESD PROTECTION CIRCUIT THROUGH GATE-COUPLING

BACKGROUND OF THE INVENTION

1. Field of the Invention

The invention generally relates to a technique for preventing electrostatic discharge damage to integrated circuits. More particularly, the invention relates to an electrostatic discharge protection circuit triggered by punchthrough through gate-coupling.

2. Description of the Related Art

Electrostatic discharge, ESD hereinafter, is a common phenomenon that occurs during handling of semiconductor integrated circuit ("IC") devices. An electrostatic charge may accumulate for various reasons and cause potentially destructive effects on an IC device. Damage typically can occur during a testing phase of IC fabrication, during assembly of the IC onto a circuit board, as well as during use of equipment into which the IC has been installed. Damage to a single IC due to poor ESD protection in an electronic device can hamper some of its designed functions, or sometimes all of them. ESD protection for semiconductor ICs is, therefore, a reliability problem.

ESD stress models are based on the reproduction of typical discharge pulses to which the IC may be exposed during manufacturing or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

However, in light of the trend toward submicron scale IC fabrication, CMOS IC vulnerability to ESD stress has been greatly reduced due to advanced processes, such as lightly-doped drain (LDD) structure and clad silicide diffusions. Lateral silicon controlled rectifiers (LSCR) have been utilized as the main components of ESD protection circuits, for facilitating protection while allowing the submicron semiconductor devices to function acceptably. An example, R. N. Rountree et al., "A PROCESS-TOLERANT INPUT PROTECTION CIRCUIT FOR ADVANCED CMOS PROCESSES," has been proposed in EOS/ESD Symp. Proc., EOS-10, pp. 201–205, 1988.

However, there is one inherent constraining design factor for the lateral SCRs used in ESD protection circuits for sub-micron semiconductor devices. The trigger voltage for lateral SCRs in sub-micron CMOS devices is greater than 30 Volts, while the typical thickness of gate oxide layers in CMOS fabrication processes employing a resolution of 0.6–0.8 microns is about 150–200 angstroms. Considering a dielectric breakdown strength of 10 MV/cm for typical $SiO_2$ material, the gate-oxide layers in these sub-micron CMOS devices, for example, for 0.5 μm feature size, would be destroyed by a voltage of about 15–20 volts. Furthermore, for CMOS technology with a gate-oxide thickness of 105 angstroms, measurable Flower-Nordheim tunneling through the gate oxide starts at around 7V and the breakdown occurs at 14.5V.

Accordingly, efforts should be made to lower the trigger voltage below the dielectric breakdown voltage of the gate-oxide layers of the CMOS device, so that the ESD protection circuits can provide protection for the CMOS device before being damaged themselves.

SUMMARY OF THE INVENTION

It is therefore an object of the invention to provide a punchthrough-triggered ESD protection circuit having a lower trigger voltage, which can be positioned at IC input pads or output pads so as to protect the internal circuit to which it is connected from ESD damage.

The invention achieves the above-identified object by providing an electrostatic discharge protection circuit to be arranged at an IC pad for protecting an internal circuit of an integrated circuit from ESD damage. The protection circuit includes a P-type silicon substrate, an N-well region formed in the P-type silicon substrate, a P-type doped region formed in the N-well region for connection to the IC pad, and a N-type doped region formed in the P-type silicon substrate. The N-type doped region is spaced apart from the N-well region and is disposed for connection to a circuit ground of the integrated circuit. The P-type doped region, the N-well region, the P-type silicon substrate, and the N-type doped region form a silicon controlled rectifier. The protection circuit also includes a gate structure overlying the P-type silicon substrate between the N-well region and the N-type doped region. The gate structure, the N-type doped region, and the N-well region form a transistor. The protection circuit also includes a control circuit for providing a gate voltage to the gate structure. A punchthrough voltage of the transistor is determined by the spacing between the N-type doped region and the N-well region, as well as by the gate voltage.

Furthermore, the invention achieves the above-identified objects by providing an electrostatic discharge protection circuit arranged at an IC pad for protecting an internal circuit of an integrated circuit from ESD damage. The protection circuit includes an N-type silicon substrate, a P-well region formed in the N-type silicon substrate, a P-type doped region formed in the N-type silicon substrate for connection to the IC pad, and a N-type doped region formed in the P-well region. The N-type doped region is spaced apart from the N-type silicon substrate and is disposed for connection to a circuit ground of the integrated circuit. The P-type doped region, the N-type silicon substrate, the P-well region, and the N-type doped region form a silicon controlled rectifier. The protection circuit also includes a gate structure overlying the P-well region between the N-type silicon substrate and the N-type doped region. The gate structure, the N-type doped region, and the N-well region form a transistor. The protection circuit also includes a control circuit for providing a gate voltage to the gate structure. A punchthrough voltage of the transistor is determined by the spacing between the N-type doped region and the N-type silicon substrate, as well as by the gate voltage.

BRIEF DESCRIPTION OF THE DRAWINGS

Other objects, features, and advantages of the invention will become apparent by way of the following detailed description of the preferred but non-limiting embodiments. The description is made with reference to the accompanying drawings, wherein.

DESCRIPTION OF THE PREFERRED EMBODIMENTS

Figure 1:
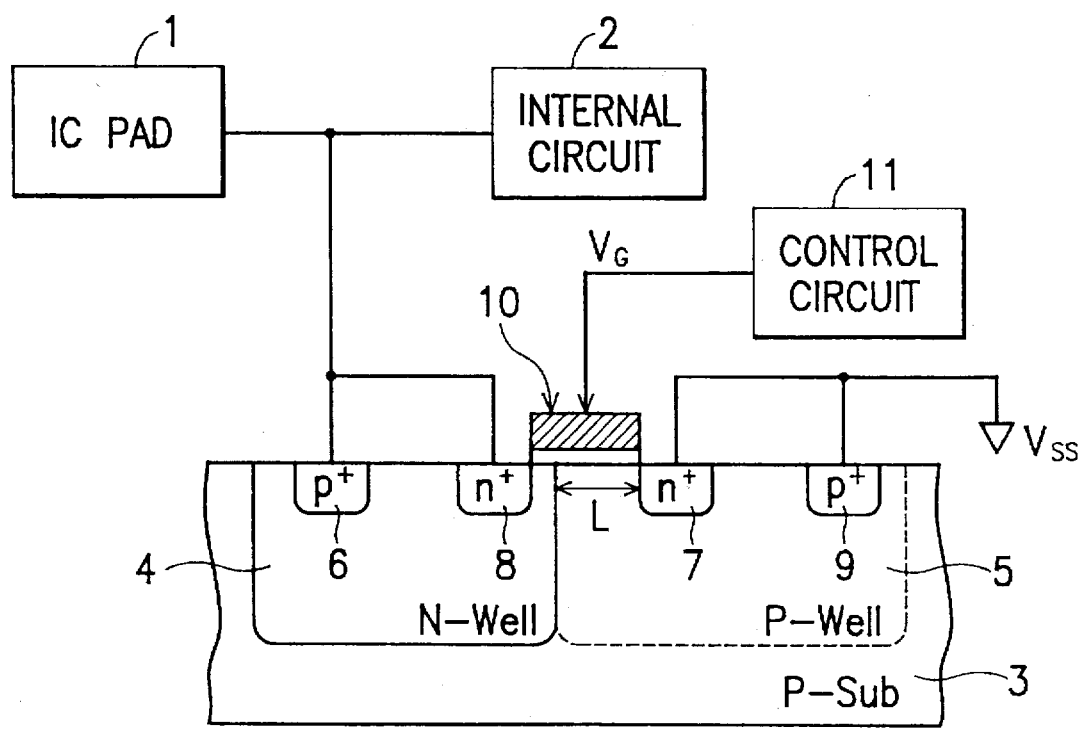
FIG. 1 schematically depicts one preferred embodiment in accordance with the invention in cross-sectional view.

Referring to FIG. 1, one preferred embodiment in accordance with the invention is schematically depicted in cross-sectional view. A punchthrough-triggered ESD protection circuit according to the invention is positioned at an IC pad 1, which is connected to an internal circuit 2 of the integrated circuit. When ESD stress appears at the IC pad 1, the punchthrough-triggered ESD protection circuit is used to conduct the resulting ESD current and, therefore, bypass the ESD stress in order to protect the internal circuit 2 from ESD damage.

As shown in FIG. 1, the punchthrough-triggered ESD protection circuit is fabricated on a P-type silicon substrate 3 in which an N-well region 4 is formed. A P-well region 5, which might optionally be formed in the silicon substrate 3 adjacent to the N-well region 4, is drawn with dashed lines. A first P-type doped region 6 formed in the N-well region 3 is connected to the IC pad 1. A first N-type doped region 7 formed in the P-type silicon substrate 3 is spaced from the N-well region 4 by a spacing distance L and is connected to circuit ground $V_{SS}$. Accordingly, the first P-type doped region 6, the N-well region 4, the P-type silicon substrate 3 (or the P-well region 5), and the first N-type doped region 7 form a lateral silicon controlled rectifier.

A gate structure 10, consisting of a gate electrode atop a gate dielectric layer, overlies a portion of the P-type silicon substrate 3 between the N-well region 4 and the first N-type doped region 7. Therefore, the gate structure 10, the N-well region 4, and the first N-type doped region 7 form an N-type metal-oxide-semiconductor (MOS) field-effect transistor (FET). The channel length of the MOSFET is the spacing distance L between the first N-type doped region 7 and the N-well region 4.

A control circuit 11 is used to provide a gate voltage $V_G$ to the gate electrode of the gate structure 10. Both the gate voltage $V_G$ and the spacing L are utilized to adjust the punchthrough voltage of the NMOS transistor. Preferably, the N-well region 4 has a doping concentration of about $1 \times 10^{16} - 5 \times 10^{17}$ cm$^{-3}$ and a junction depth of about 1.8–2.5 µm; the first N-type doped region 7 has a junction depth of about 0.15–0.25 µm and a junction breakdown voltage of about 11–13V. Accordingly, if the spacing distance L ranges from about 1.3 µm to about 4 µm, at $V_G$=0V, the breakdown (punchthrough) voltage will range from about 8V to about 15V; if $V_G$ is about 1V, the breakdown voltage of the NMOSFET can be lowered to the range of about 6–10V.

Moreover, a second N-type doped region 8 is formed in the N-well region 4 and is electrically coupled to the first P-type doped region 6. The second N-type doped region 8 is not limited to the position shown in FIG. 1; an arbitrary position within the N-well region 4 may be utilized. A second P-type doped region 9 formed in the P-type silicon substrate 3 is located farther from the N-well region 4 than the first N-type doped region 7 and is connected to the first N-type doped region 7.

Figure 2:
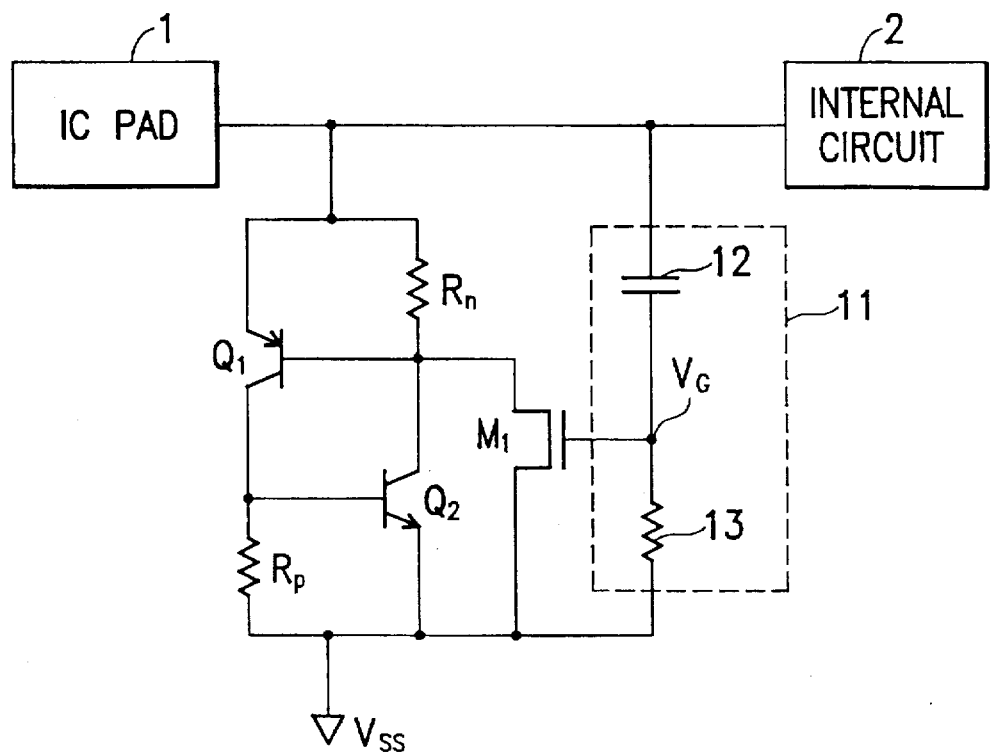
FIG. 2 depicts one equivalent circuit diagram of FIG. 1.

Referring to FIG. 2, one equivalent circuit diagram of the protection circuit shown in FIG. 1 is schematically depicted.

In accordance with FIG. 1, the first P-type doped region 6, the N-well region 4, the P-type silicon substrate 3 serve as the emitter, the base, and the collector, respectively, of a PNP bipolar junction transistor $Q_1$ depicted in FIG. 2. The N-well region 4, the P-type silicon substrate 3, and the first N-type doped region 7 serve as the collector, the base, and the emitter, respectively, of an NPN bipolar junction transistor $Q_2$ as depicted in FIG. 2. The base of the transistor $Q_1$ is tied to the collector of the transistor $Q_2$, and the collector of the transistor $Q_1$ is tied to the base of the transistor $Q_2$, thereby forming the lateral silicon-controlled rectifier. The emitters of the transistors $Q_1$ and $Q_2$ are connected to the IC pad 1 and the circuit ground $V_{SS}$, respectively. Moreover, the drain, gate, and source of an NMOS transistor $M_1$ are formed by the N-well region 4 (or the second N-type doped region 8), the gate structure 10, and the first N-type doped region 7, respectively. As shown in FIG. 2, two resistors Rn and Rp represent the spreading resistance of the N-well region 4 and the P-type silicon substrate 3, respectively.

As depicted in FIG. 2, the control circuit 11 consists of a capacitor 12 and a resistor 13. The capacitor 12 is connected between the IC pad 1 and the gate, that is, the gate terminal shown in FIG. 1, of the NMOS transistor $M_1$. The resistor 13 is connected between the gate of the NMOS transistor $M_1$ and circuit ground $V_{SS}$. Accordingly, the gate voltage $V_G$ coupled to the gate of the NMOS transistor $M_1$ is determined by the values of the capacitor 12 and the resistor 13. Therefore, the gate voltage $V_G$ can be coordinated with the spacing L so as to adjust the punchthrough voltage of the NMOS transistor $M_1$ to a predetermined value. When ESD stress is present at the IC pad 1, the breakdown of the NMOS transistor $M_1$ resulting from the punchthrough effect triggers the lateral silicon-controlled rectifier formed by of the bipolar junction transistors $Q_1$ and $Q_2$ to turn on and therefore bypass the ESD stress. During normal operation, the gate voltage $V_G$ node is connected through the resistor 13 to $V_{ss}$ (generally, 0V), thereby turning off the NMOS transistor $M_1$.

Figure 3:
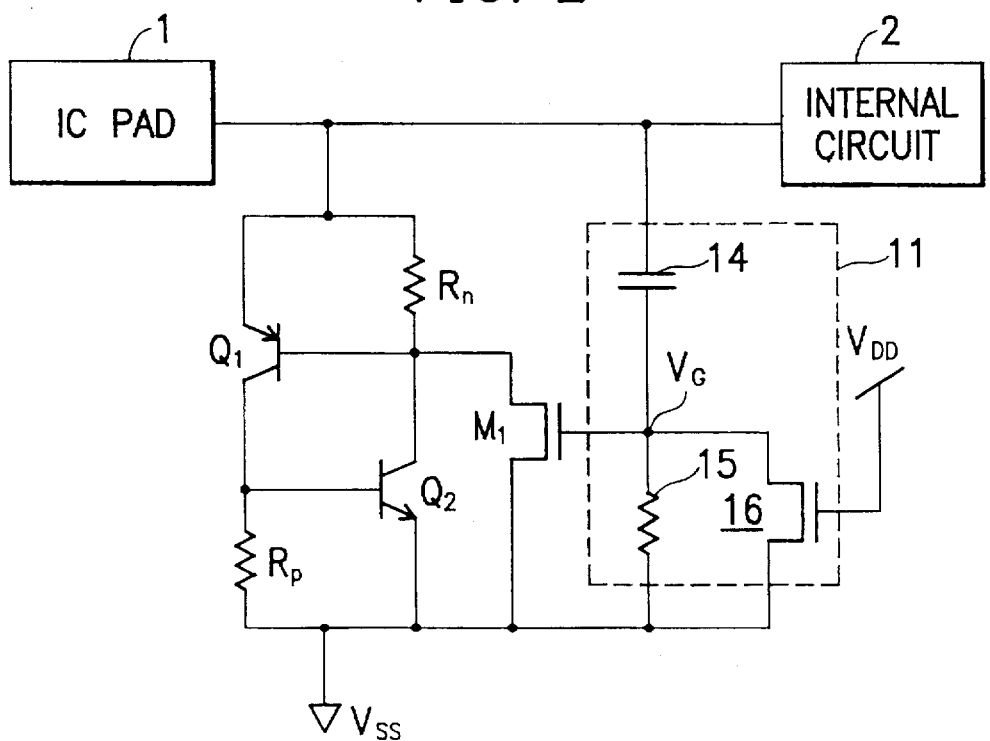
FIG. 3 depicts another equivalent circuit diagram of FIG. 1.

Next, referring to FIG. 3, another equivalent circuit of the protection circuit shown in FIG. 1 is schematically depicted. The control circuit 11 depicted in FIG. 3 consists of a capacitor 14, a resistor 15 and an NMOS transistor 16. The capacitor 14 is connected between the IC pad 1 and the gate of the NMOS transistor $M_1$. The resistor 15 is connected between the gate of the transistor $M_1$ and the $V_{SS}$. The NMOS transistor 16 is configured with its drain and source connected to the gate of the NMOS transistor $M_1$ and $V_{SS}$, respectively. The gate of the NMOS transistor 16 is controlled by a power voltage $V_{DD}$. As differentiated from FIG. 2, $V_{DD}$ might be powered to 5V during normal operation, thereby turning on conduction of the NMOS transistor 16 and connecting $V_G$ to circuit ground $V_{SS}$.

Figure 4:
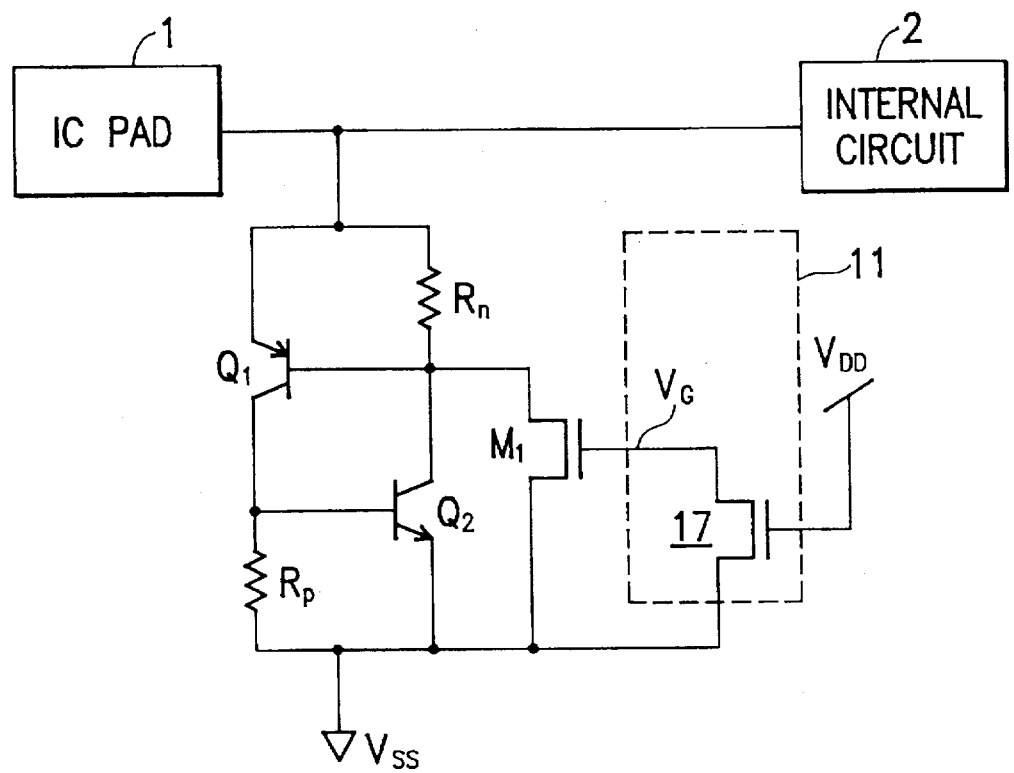
FIG. 4 depicts a further equivalent circuit diagram of FIG. 1.

Referring to FIG. 4, a further equivalent circuit of the protection circuit shown in FIG. 1 is schematically depicted. The control circuit 11 depicted in FIG. 4 consists of an NMOS transistor 17. The NMOS transistor 17 is configured with its drain and source connected to the gate of the NMOS transistor $M_1$ and $V_{SS}$, respectively. The gate of the NMOS transistor 17 is controlled by a power source $V_{DD}$. During normal operation, $V_{DD}$ is powered to 5V, thereby turning on the NMOS transistor 17 and connecting $V_G$ to circuit ground $V_{SS}$. When ESD stress is present at the IC pad 1, the potential of the gate voltage $V_G$ is sustained at 0V; however, the punchthrough voltage of the transistor $M_1$ can lowered by adjusting the spacing L.

Figure 5:
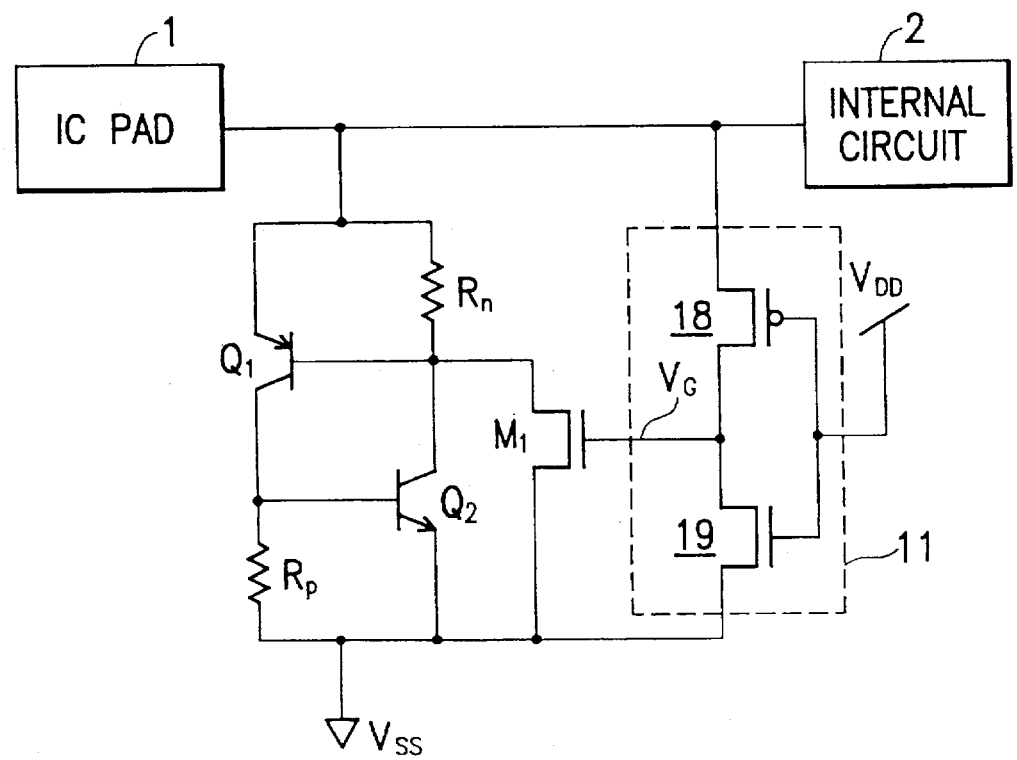
FIG. 5 depicts yet another equivalent circuit diagram of FIG. 1.

Referring to FIG. 5, yet another equivalent circuit of the protection circuit shown in FIG. 1 is schematically depicted.

Essentially, the control circuit 11 depicted in FIG. 5 is an inverter. The inverter is formed by a PMOS transistor 18 and an NMOS transistor 19. The drains of the transistors 18 and 19 are tied together and are connected to the gate of the transistor $M_1$. The sources of the transistors 18 and 19 are connected to the IC pad 1 and $V_{SS}$, respectively. Both gates of the transistors 18 and 19 are controlled by a power source $V_{DD}$. When ESD stress is present at the IC pad 1, $V_{DD}$ is held at about 0V and the gate voltage $V_G$ is adjusted by the aspect ratios of the PMOS transistor 18 to the NMOS transistor 19. Moreover, the spacing L together with the gate voltage $V_G$ adjust the punchthrough voltage of the transistor $M_1$ to a predetermined value. By means of the breakdown of the NMOS transistor $M_1$ resulting from the punchthrough effect, the lateral silicon-controlled rectifier is triggered to turn on and then bypass the ESD stress. During normal operation, $V_{DD}$ is powered to about 5V and the electrical potential of the gate voltage $V_G$ is connected to $V_{SS}$ through the NMOS transistor 19.

Figure 6:
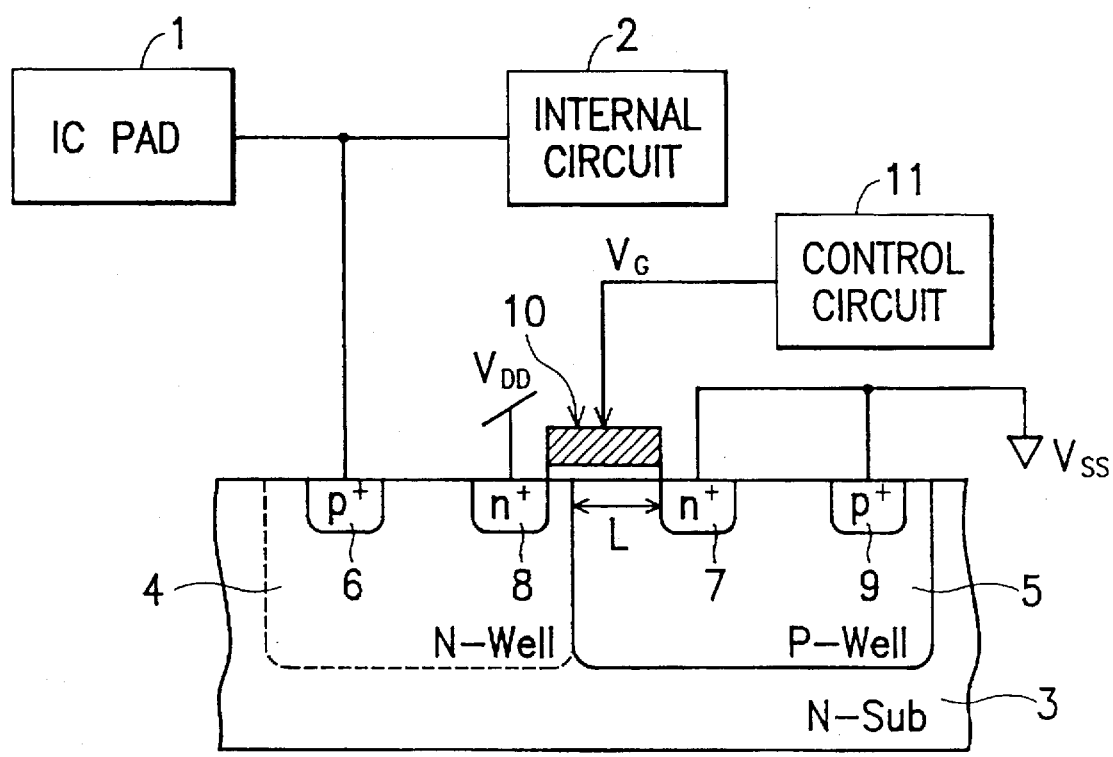
FIG. 6 depicts another preferred embodiment in accordance with the invention, illustrated in cross-sectional view.

FIG. 1 schematically depicts the protection circuit fabricated on a P-type silicon substrate in cross-sectional view. However, if the protection circuit is fabricated on an N-type silicon substrate, the cross-sectional view is as depicted in FIG. 6. Compared to FIG. 1, the P-well 5 region is necessary, but the N-well region 4 is an optional portion drawn with dashed lines. Furthermore, the second N-type doped region 8 is connected to the power source $V_{DD}$. Applying the same reasoning used in the above examples, the control circuit 11 as depicted in FIG. 6 can be formed by those components shown in FIGS. 2–5.

In conclusion, the invention, a punchthrough-triggered ESD protection circuit, disposes an NMOS transistor at the anode gate of a lateral silicon-controlled rectifier, and a control circuit provides a gate voltage for the gate of the NMOS transistor. By controlling the channel length of the NMOS transistor as well as the gate voltage, the punchthrough voltage of the NMOS transistor is adjusted to a predetermined level. When ESD stress appears at the IC pad, the NMOS transistor is operated into breakdown because of punchthrough effects and then triggers on the lateral silicon-controlled rectifier. Accordingly, the ESD stress at the IC pad can be bypassed by the conducting ESD protection circuit to prevent ESD damage to the internal circuit. Thus, the trigger voltage of the ESD voltage in accordance with the invention can be lowered to the punchthrough voltage of the NMOS transistor.

What is claimed is:

1. An electrostatic discharge protection circuit to be arranged at an IC pad for protecting an internal circuit within an integrated circuit from ESD damage, the electrostatic discharge protection circuit comprising:

a P-type silicon substrate;

an N-well region formed in the P-type silicon substrate;

a P-type doped region formed in the N-well region to be electrically connected to the IC pad;

an N-type doped region formed in the P-type silicon substrate and separated from the N-well region by a spacing, for electrical connection to a circuit ground of the integrated circuit, wherein the P-type doped region, the N-well region, the P-type silicon substrate, and the N-type doped region form a silicon-controlled rectifier;

a gate structure overlying the P-type silicon substrate between the N-well region and the N-type doped region, wherein the gate structure, the N-type doped region, and the N-well region form a transistor; and a control circuit for providing a gate voltage to the gate structure, wherein a punchthrough voltage of the transistor is determined by the spacing as well as by the gate voltage.

2. The protection circuit as claimed in claim 1, wherein the N-type doped region is a first N-type doped region and the P-type doped region is a first P-type doped region, the protection circuit further comprising:

a second N-type doped region formed in the N-well region and electrically connected to the first P-type doped region; and a second P-type doped region formed in the P-type silicon substrate and disposed at a distance away from the N-well region which is greater than a distance of the first N-type doped region from the N-well region and electrically connected to the first N-type doped region.

3. The protection circuit as claimed in claim 1, wherein the N-well region has a doping concentration of about $1 \times 10^{16}$ to $5 \times 10^{17}$ cm$^{-3}$ and a junction depth of about 1.8 to 2.5 μm.

4. The protection circuit as claimed in claim 3, wherein the N-type doped region has a junction depth of about 0.15 to 0.25 μm and a junction breakdown voltage of about 11 to 13 volts.

5. The protection circuit as claimed in claim 4, wherein the spacing is within a range from about 1.3 μm to about 4 μm, and the punchthrough voltage of the transistor is within a range from about 8 volts to about 15 volts.

6. The protection circuit as claimed in claim 4, wherein the punchthrough voltage is within a range from about 6 volts to about 10 volts, and the gate voltage is set to about 1 volt.

7. The protection circuit as claimed in claim 1, wherein the control circuit comprises:

a capacitor electrically connected between the P-type doped region and the gate structure; and a resistor electrically connected between the N-type doped region and the gate structure.

8. The protection circuit as claimed in claim 7, wherein the control circuit further comprises an NMOS transistor having a drain electrically connected to the gate structure, a source for electrical connection to the circuit ground, and a gate for biasing by a power source of the integrated circuit.

9. The protection circuit as claimed in claim 1, wherein the control circuit includes an NMOS transistor having a drain electrically connected to the gate structure, a source for electrical connection to the circuit ground, and a gate for biasing by a power source of the integrated circuit.

10. The protection circuit as claimed in claim 1, wherein the control circuit includes an inverter having an input terminal for electrical connection to a power source of the integrated circuit and an output terminal for providing the gate voltage to the gate structure.

11. An electrostatic discharge protection circuit to be arranged at an IC pad for protecting an internal circuit of an integrated circuit from ESD damage, the electrostatic discharge protection circuit comprising:

an N-type silicon substrate;

a P-well region formed in the N-type silicon substrate;

a P-type doped region formed in the N-type silicon substrate to be electrically connected to the IC pad;

an N-type doped region formed in the P-well region and separated from the N-type silicon substrate by a spacing, for electrical connection to a circuit ground of the integrated circuit, wherein the P-type doped region, the N-type silicon substrate, the P-well region, and the N-type doped region form a silicon-controlled rectifier;

a gate structure overlying the P-well region between the N-type silicon substrate and the N-type doped region, wherein the gate structure, the N-type doped region, and the N-well region form a transistor; and a control circuit for providing a gate voltage to the gate structure, wherein a punchthrough voltage of the transistor is determined by the spacing as well as by the gate voltage.

12. The protection circuit as claimed in claim 11, wherein the N-type doped region is a first N-type doped region and the P-type doped region is a first P-type doped region, the protection circuit further comprising:

a second N-type doped region formed in the N-type silicon substrate for electrical connection to a power source of the integrated circuit; and a second P-type doped region formed in the P-well region and disposed at a distance away from the gate structure which is greater than a distance of the first N-type doped region from the gate structure and electrically connected to the first N-type doped region.

13. The protection circuit as claimed in claim 11, wherein the P-well region has a doping concentration of about $1\times10^{16}$ to $5\times10^{17}$ cm$^{-3}$ and a junction depth of about 1.8 to 2.5 μm.

14. The protection circuit as claimed in claim 13, wherein the N-type doped region has a junction depth of about 0.15 to 0.25 μm and a junction breakdown voltage of about 11 to 13 volts.

15. The protection circuit as claimed in claim 14, wherein the spacing is within a range from about 1.3 μm to about 4 μm, and the punchthrough voltage of the transistor is within a range from about 8 volts to about 15 volts.

16. The protection circuit as claimed in claim 14, wherein the punchthrough voltage is within a range from about 6 volts to about 10 volts, and the gate voltage is set to about 1 volt.

17. The protection circuit as claimed in claim 12, wherein the control circuit comprises:

a capacitor electrically connected between the P-type doped region and the gate structure; and a resistor electrically connected between the N-type doped region and the gate structure.

18. The protection circuit as claimed in claim 17, wherein the control circuit further comprises an NMOS transistor having a drain electrically connected to the gate structure, a source for electrical connection to the circuit ground, and a gate for biasing by the power source.

19. The protection circuit as claimed in claim 12, wherein the control circuit includes an NMOS transistor having a drain electrically connected to the gate structure, a source for electrical connection to the circuit ground, and a gate for biasing by the power source.

20. The protection circuit as claimed in claim 12, wherein the control circuit includes an inverter having an input terminal for electrical connection to the power source and an output terminal for providing the gate voltage to the gate structure.

21. The protection circuit as claimed in claim 1, wherein the control circuit includes:

a PMOS transistor having a source electrically connected to the P-type doped region, a drain electrically connected to the gate structure, and a gate for biasing by a power source of the integrated circuit; and an NMOS transistor having a source electrically connected to the N-type doped region, a drain electrically connected to the gate structure, and a gate for biasing by the power source.

22. The protection circuit as claimed in claim 12, wherein the control circuit includes:

a PMOS transistor having a source electrically connected to the P-type doped region, a drain electrically connected to the gate structure, and a gate for biasing by the power source; and an NMOS transistor having a source electrically connected to the N-type doped region, a drain electrically connected to the gate structure, and a gate for biasing by the power source.

* * * * *